(12) United States Patent
Lu et al.

(10) Patent No.: US 10,308,504 B2
(45) Date of Patent: Jun. 4, 2019

(54) HIERARCHICAL MICRO ASSEMBLER SYSTEM

(71) Applicant: Palo Alto Research Center Incorporated, Palo Alto, CA (US)

(72) Inventors: Jeng Ping Lu, Fremont, CA (US); Eugene M. Chow, Palo Alto, CA (US); David K. Biegelsen, Portola Valley, CA (US); Sourobh Raychaudhuri, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 15/476,843

(22) Filed: Mar. 31, 2017

(65) Prior Publication Data
US 2018/0282151 A1    Oct. 4, 2018

(51) Int. Cl.
| | |
|---|---|
| *H01L 21/06* | (2006.01) |
| *B81C 1/00* | (2006.01) |
| *B82Y 30/00* | (2011.01) |
| *B82Y 40/00* | (2011.01) |
| *H01L 21/027* | (2006.01) |
| *H01L 29/06* | (2006.01) |

(52) U.S. Cl.
CPC ......... *B81C 1/00031* (2013.01); *B82Y 30/00* (2013.01); *B82Y 40/00* (2013.01); *H01L 21/027* (2013.01); *H01L 21/06* (2013.01); *H01L 29/0665* (2013.01); *B81B 2207/05* (2013.01); *B81B 2207/056* (2013.01); *B81C 1/00015* (2013.01); *B81C 2201/0149* (2013.01); *Y02E 10/50* (2013.01)

(58) Field of Classification Search
CPC .................................................. H01L 29/14605
USPC ......................................................... 438/668
See application file for complete search history.

(56) References Cited

U.S. PATENT DOCUMENTS 6,107,685 A * 8/2000 Nishiyama ............ H01L 21/563
257/737
6,309,049 B1 * 10/2001 Salmon ................. G03G 15/348
347/55

(Continued)

OTHER PUBLICATIONS

U.S. Appl. No. 15/476,830, filed Mar. 31, 2017, Hierarchical Micro Assembler System.

*Primary Examiner* — Chandra Chaudhari
(74) *Attorney, Agent, or Firm* — Womble Bond Dickinson (US) LLP; Daniel E. Ovanezian

(57) ABSTRACT

A method of manufacturing and using micro assembler systems are described. A method of manufacturing includes disposing a first plurality of electrodes above a first zone of the substrate, wherein the first plurality of electrodes has a first range of spacing. The method further includes disposing a second plurality of electrodes above a second zone of the substrate, wherein the second plurality of electrodes has a second range of spacing that is less than the first range of spacing. A method of using micro assembler systems includes disposing a mobile particle at least partially submersed in an assembly medium above a substrate, a first plurality of electrodes and a second plurality of electrodes. The method further includes conducting a field through individual electrodes of the first plurality of electrodes and the second plurality of electrodes to generate electrophoretic forces or dielectrophoretic forces on the mobile particle.

19 Claims, 5 Drawing Sheets

(56) References Cited

U.S. PATENT DOCUMENTS

| | | | |
|---|---|---|---|
| 6,368,754 B1* | 4/2002 | Imai | G03F 1/00 |
| | | | 430/394 |
| 7,332,361 B2 | 2/2008 | Lu et al. | |
| 2006/0060987 A1* | 3/2006 | Chen | H01L 21/563 |
| | | | 257/787 |
| 2014/0209463 A1* | 7/2014 | Gibson | B03C 5/005 |
| | | | 204/547 |

* cited by examiner

HIERARCHICAL MICRO ASSEMBLER SYSTEM

STATEMENT REGARDING FEDERALLY SPONSORED RESEARCH AND DEVELOPMENT

This invention was made with Government support under contract FA8650-15-C-7544 awarded by the Defense Advanced Research Projects Agency. The Government has certain rights in this invention.

BACKGROUND

Xerographic micro assembly is a method of fabricating devices using xerographic like, electrostatic force based directed assembly techniques to assemble functional micro objects to complex device structure. Mobile micro objects may be immersed in an assembly medium that covers an electrode array. An electric field pattern may be applied to the electrode array that attracts the mobile micro objects. The electric field pattern may attract or repel the mobile micro objects, which may guide the mobile micro objects into a specific position and orientation above the electrode array.

BRIEF DESCRIPTION OF THE DRAWINGS

The present disclosure described herein is illustrated by way of example and not by way of limitation in the accompanying figures. For simplicity and clarity of illustration, features illustrated in the figures are not necessarily drawn to scale. For example, the dimensions of some features may be exaggerated relative to other features for clarity. Further, where considered appropriate, reference labels have been repeated among the figures to indicate corresponding or analogous elements.

DETAILED DESCRIPTION

Figure 1:
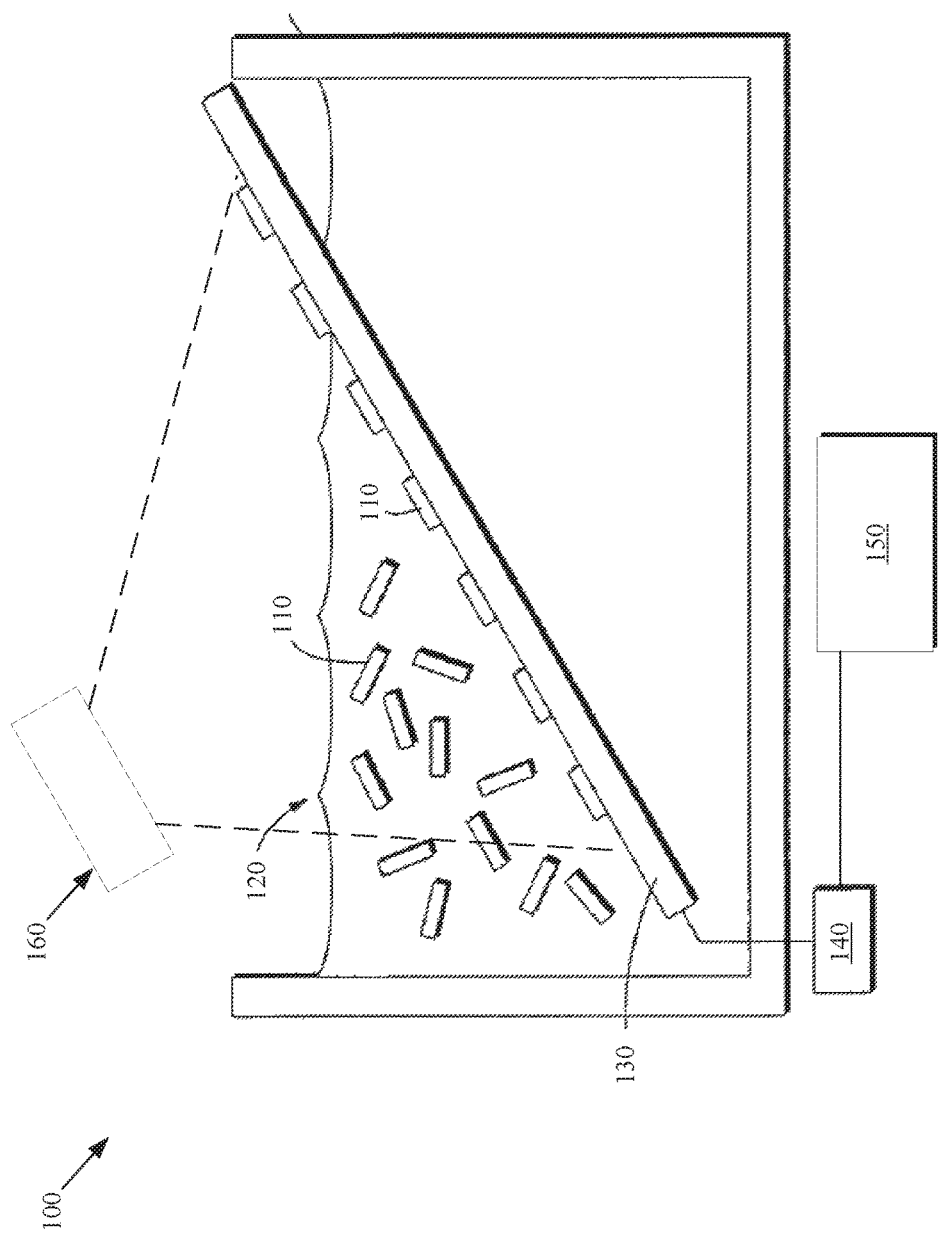
FIG. 1 illustrates a micro assembly system in accordance with embodiments of the present disclosure.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Demand for semiconductor devices having high densities of surface mounted components continues to increase. For example, a semiconductor device may contain hundreds or thousands of surface mounted components that must be placed on a substrate in the proper position with the correct orientation. One method of placing these surface mounted components is known as micro assembly. In micro assembly, a plurality of mobile micro objects (e.g., chiplets) may be immersed in an assembly medium (e.g., a dielectric fluid). An electrode array may be submerged in a container having the assembly medium containing the mobile micro objects. The electrode array may generate a patterned field to position and orient the mobile micro objects in locations above the electrode array by selectively energizing individual electrodes of the electrode array. The field generated by the electrode array may exert electrophoretic or dielectrophoretic forces on the mobile micro objects causing the mobile micro objects to move relative to the assembly medium and the array. The position may refer to a point or place relative to the electrode array. The orientation may be the rotation of the mobile particle relative to the electrode array. The mobile micro objects may be moved, via the field, above the surface of the electrode array until each of the mobile micro objects is positioned and oriented at a location above the electrode array. Once the mobile micro objects are in the specific locations, the electrode array may be used to transport the mobile micro objects, where they may be transferred to a final substrate. Challenges of micro assembly may include large amounts of computing data being required to selectively energize and monitor the individual electrodes of the electrode array. If the density of electrodes on the electrode array remains constant, as the size of the electrode array increases the amount of computing data required increases proportionately to the area of the electrode array. Increasing the refresh rate (e.g., how frequently computations are performed) further increases the amount of computing data required. Furthermore, manufacturing an electrode array having a high density of electrodes requires the use of more expensive manufacturing processes, making producing electrode arrays on larger scales impractical. Moreover, due to scaling of the field generated by the electrodes, only a low voltage (e.g., less than 10 volts) may be provided to electrode arrays having a high density of electrodes before failure may occur, despite high voltages (e.g. >100V) being desirable in particular situations.

The present disclosure addresses the above-mentioned and other deficiencies by providing for an electrode array having a first zone (e.g., low resolution zone) having electrodes spaced relatively far apart that may coarsely position and orient the mobile micro objects within a defined area. The electrode array may have a second zone (e.g., high resolution zone) having electrodes spaced closer together than the first zone that may more precisely position and orient the mobile micro objects at specific locations and orientations within the defined area. The present disclosure may reduce the amount of computational data required to selectively energize and monitor the individual electrodes of the electrode array by decreasing the total number of electrodes. The present disclosure may decrease manufacturing costs of the electrode array by allowing portions of the electrode array (e.g. the low resolution zone) to be manufactured using less expensive methods. The present disclosure may allow higher voltages to be used in low resolution zones than in higher resolution zones without failure occurring. In implementations, the electrode assembly includes a substrate having a first zone including a first plurality of electrodes and a second zone including a second plurality of electrodes that conduct a field to control the movement of the mobile particle to predefined positions and orientations respective to the electrode array.

FIG. 1 is a cross-sectional view of a micro assembly unit 100 for use with implementations of the present disclosure. The micro assembly unit 100 includes a container that holds an assembly medium 120. In some implementations, the assembly medium 120 may be a dielectric fluid. In other implementations, the assembly medium 120 may be a gas, such as nitrogen. The mobile micro objects 110 may be immersed in the assembly medium 120 as illustrated in FIG. 1. In one implementation, the mobile particle 110 may be any particle that has at least one substantially planar surface. The substantially planar surface may be a surface of the mobile particle having a local roughness (e.g., height of a feature on the substantially planar surface) that is less than 10% of the length of the particle. In other implementations, the mobile particle 110 may be spherical, ellipsoidal or any other suitable geometry. In some implementations, the mobile particle 110 may have an electrical charge or magnetic moment that allows the mobile particle 110 to be attracted or repelled by a field (e.g., electric field or magnetic field) created by an electrode array 130. In another implementation, the mobile particle 110 may not have an electrical charge and may be moved above the surface of the electrode array 130 using induced dipole forces. In one implementation, the electrode array 130 may include a substrate having non-planar structures. In another implementation, the electrode array 130 may include a substrate having a substantially planar surface. The electrode array 130 may be submerged into or coated by the assembly medium 120.

In one implementation, the substrate may have embedded electronic components. In another implementation, the substrate may have electronics placed on a surface opposite the electrodes and connected to the electrodes through vias. In yet another implementation, the substrate may be a non-planar substrate where the electrodes may be disposed above non-planar features of the substrate. In a further implementation, a planar substrate may be etched to form non-planar features on a surface of the substrate.

In one implementation, the electrode array 130 may be coupled to a controller 140. The controller 140 may determine which individual electrodes of the electrode array 130 are energized in order to generate a desired field to attract, position and orient of the mobile micro objects 110 at a position above the electrode array 130. The controller 140 may be coupled to a power source 150. The power source 150 may provide power or field to the electrode array 130 using the controller 140 in order to generate the field. In one implementation, the generated field may be an electric field produced by stationary or oscillating charges of the electrode array 130. In another implementation, the generated field may be a magnetic field produced by moving charges (i.e., current) of the electrode array 130. In a further implementation, the generated field may be an electromagnetic field that includes both the electric field and magnetic field components of the electrode array 130.

In another implementation, the electrode array 130 may be coupled directly to power source 150. The electrode array 130 may include a plurality of phototransistors, which may become energized in response to exposure to light. A surface of the electrode array 130 may be exposed to light from an optical projector 160 (also referred to as "light source" hereafter), where the optical projector projects an image corresponding to the specific position and orientation of the mobile micro objects 110. The phototransistors illuminated by the image may generate a field to attract, position and orient the mobile micro objects 110 to a location above the electrode array 130. The phototransistors that are not illuminated by the projected image may not change or generate a field. For illustration purposes, light source 160 is shown above the electrode array 130 and projecting an image onto the top surface of the electrode array 130. However, in another implementation, the light source 160 may be located below the electrode array 130 and project the image onto the bottom surface of the electrode array 130.

Figure 2:
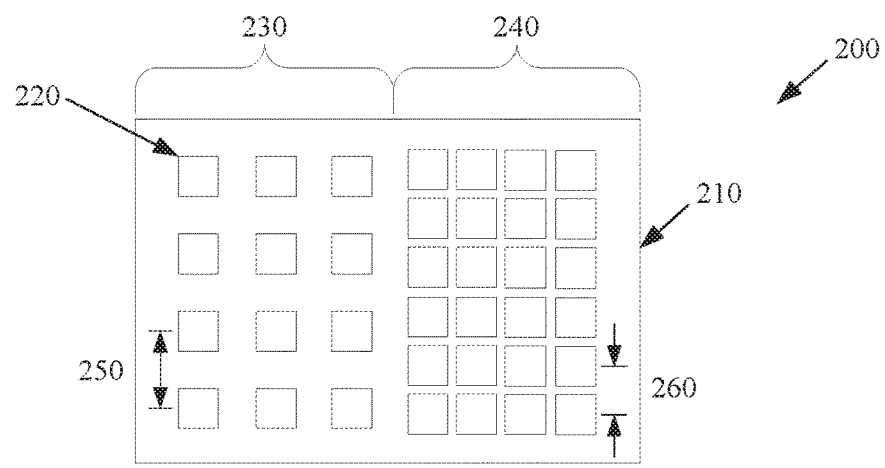
FIG. 2 illustrates an electrode array having a first zone and a second zone, according to implementations.

FIG. 2 illustrates an electrode array 200 having a first zone and a second zone, according to implementations. The electrode array 200 may be representative of electrode array 130 of FIG. 1. The electrode array 200 may include electrodes 220 disposed on the surface of substrate 210. The electrodes 220 may be any conductive material. Examples of conductive material include, but are not limited to, copper, gold, silver, indium tin oxide (ITO) film or composite materials. In one implementation, the electrodes 220 may be disposed on the surface of the substrate 210 using a photolithography process that uses light to transfer a pattern to the substrate. The photolithography process may include an etching process to remove one or more layers (or parts of one or more layers) from the surface of the substrate 210. The etching process may include dry etch or wet etch. In another implementation, the electrodes 220 may be disposed on the surface of the substrate 210 using a soft lithography process that uses patterned elastomeric stamps. In yet another implementation, the electrodes 220 may be disposed on the surface of the substrate 210 using high resolution patterning (e.g., multiple patterning), where the substrate 210 is exposed to multiple lithographic processes. In one implementation, a dielectric layer (not shown) may be disposed above the surface of the substrate 210 and electrodes 220.

The electrode array 200 may include a first zone 230 (e.g., low resolution zone) and a second zone 240 (e.g., high resolution zone). The first zone 230 may include electrodes 220 having a first range of spacing 250. The first range of spacing 250 may be the distance from the center of one electrode in the first zone 230 to the center of an adjacent electrode. In one implementation, the first range of spacing may be between 15-1000 microns, inclusively. The second zone 240 may include electrodes 220 having a second range of spacing 260. The second range of spacing 260 may be the distance from the center of one electrode in the second zone 240 to the center of an adjacent electrode. In one implementation, the second range of spacing 260 may be between 1-50 microns, inclusively. In another implementation, the second range of spacing 260 may be less than the first range of spacing 250. For illustration purposes, the first zone 230 and the second zone 240 are shown as covering a similar area of the surface of the substrate 210. However, in another implementation, the first zone 230 may cover a larger area than the second zone 240 or vice versa. In a further implementation, the electrode array 200 may include multiple first zones 230 and/or second zones 240 having varying geometries. In yet another implementation, the geometries and locations of the first zones 230 and/or second zones 240 may be based on a micro assembly process, where the geometries and locations of the first zones 230 and/or second zones 240 may be determined in order to optimize the micro assembly process. The micro assembly process may be optimized by minimizing the distance the mobile micro objects are required to travel above the surface of the electrode array 200 and/or minimizing the time required to position the mobile micro objects in their specific position and orientation.

Figure 3:
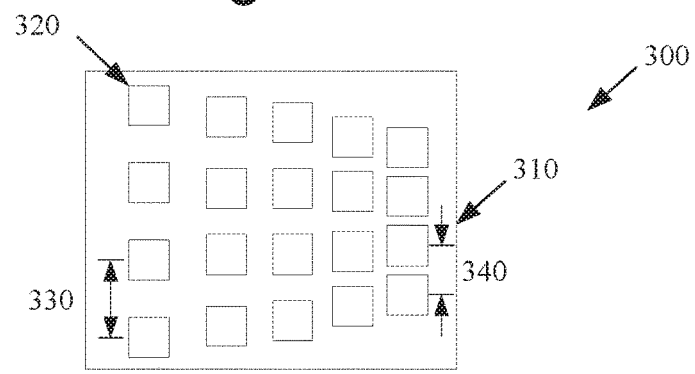
FIG. 3 illustrates an electrode array having electrodes with a decreasing range of spacing, according to implementations.

FIG. 3 illustrates an electrode array 300 having electrodes with a decreasing range of spacing, according to implementations. The electrode array 300 may be representative of electrode array 130 of FIG. 1. The electrode array 300 may include electrodes 320 disposed on the surface of substrate 310. The electrodes may be disposed on the surface of the substrate 310 using a photolithography process, a soft lithography process, high resolution patterning or any similar process. The electrodes 310 may have a first range of spacing 320 and a second range of spacing 330. The first range of spacing 320 may be the distance from the center of one electrode to the center of an adjacent electrode. In one implementation, the first range of spacing 320 may be between 15-1000 microns, inclusively. Moving from the left side to the right side of the electrode array 300, the range of spacing may incrementally decrease or increase (e.g., a gradient in spacing). The electrodes 310 near the right side of the electrode array 300 may have a second range of spacing 330. In one implementation, the second range of spacing 330 may be between 1-50 microns, inclusively. In another implementation, the second range of spacing 330 may be less than the first range of spacing 320. In one implementation, the first zone 230 and/or second zone 240 may have electrodes with a decreasing range of spacing. In another implementation, the range of spacing of the electrodes in the first zone 230 may decrease near the second zone 240. In a further implementation, the range of spacing of the electrodes of the second zone 240 may decrease near the center of the second zone 240. In a further implementation, the range of spacing of the electrodes 310 may be dependent on a micro assembly process, where the range of spacing of the electrodes 310 may be determined in order to optimize the micro assembly process as previously discussed. For illustration purposes, electrode array 300 is shown having a linear gradient in the spacing of electrodes, where the range of spacing decreases from the left side of the electrode array 300 to the right side of the electrode array 300. However, in some implementations, the electrode array 300 may have a radial gradient in the spacing of electrodes, where the range of spacing decreases from the outside of the electrode array 300 to the center of the electrode array 300.

Figure 4:
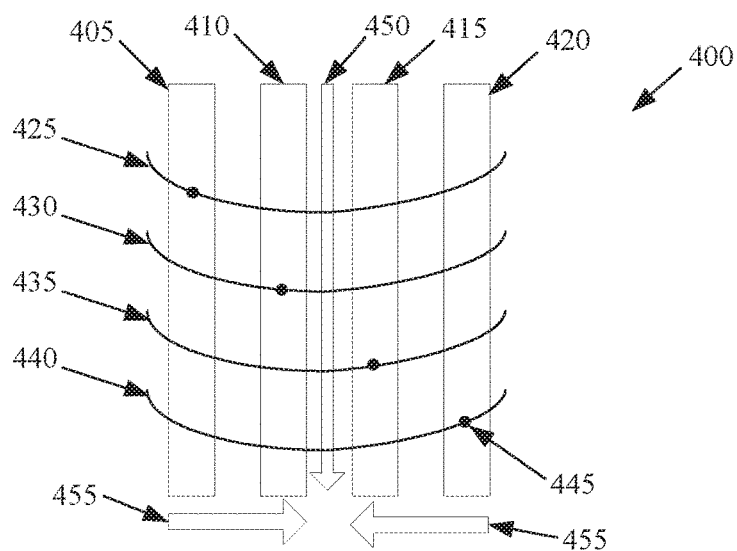
FIG. 4 illustrates a multi-phase electrode assembly, according to implementations.

FIG. 4 illustrates a multi-phase electrode assembly 400, according to implementations. The multi-phase electrode assembly 400 may be disposed on the surface of a substrate, such as substrates 210 and 310 of FIGS. 2 and 3, respectively. The multi-phase electrode assembly 400 may include traces 405, 410, 415 and 420. Traces 405, 410, 415 and 420 may be any conductive material. Examples of conductive material include, but are not limited to, copper, gold, silver, or composite materials. Traces 405, 410, 415 and 420 may be disposed using a photolithography process, a soft lithography process, high resolution patterning or any similar process. The multi-phase electrode assembly 400 may also include electrodes 425, 430, 435 and 440. Electrodes 425, 430, 435 and 440 may be any conductive material. Examples of conductive material include, but are not limited to, copper, gold, silver, ITO film or composite materials. Electrodes 425, 430, 435 and 440 may be disposed using a photolithography process, a soft lithography process, high resolution patterning or any similar process. In some implementations, a dielectric layer (not shown) may be disposed above traces 405, 410, 415 and 420 and below electrodes 425, 430, 435 and 440, forming an electrically insulating layer between traces 405, 410, 415 and 420 and electrodes 425, 430, 435 and 440. The multi-phase electrode assembly 400 may include vias 445 through the dielectric layer to couple electrodes 425, 430, 435 and 440 to traces 405, 410, 415 and 420, respectively. In some implementations, a dielectric layer (not shown) may be disposed above electrodes 425, 430, 435 and 440.

Traces 405, 410, 415 and 420 may receive power from a power source, such as power source 150 of FIG. 1. The voltage supplied to traces 405, 410, 415 and 420 may then be sequentially changed using a controller, such as controller 140 of FIG. 1. For example, initially traces 405, 410, 415 and 420 may all receive power at the same voltage from the power source 150. Then, the controller 140 may decrease or increase the voltage of trace 405. Following this, the voltage of trace 405 may be returned to its original value and the controller may decrease or increase the voltage of trace 410. This process may be repeated sequentially for traces 415 and 420. By sequentially changing the voltage on traces 405, 410, 415 and 420 electrodes 425, 430, 435 and 440 may generate a potential wave (e.g., electric wave or magnetic wave) to move the mobile micro objects above the surface of an electrode array. As the voltage of traces 405, 410, 415 and 420 are sequentially changed, a mobile particle may move (e.g., surf) the potential wave down the multi-phase electrode assembly 400, as illustrated by arrow 450. As the mobile particle moves down the multi-phase electrode assembly 400, the potential wave may also move the mobile particle towards the center of the multi-phase electrode assembly, as illustrated by arrows 455. Although the multi-phase electrode assembly 400 may be illustrated as a four phase electrode assembly, in other embodiments the multi-phase electrode assembly 400 may include more or less phases.

Figure 5:
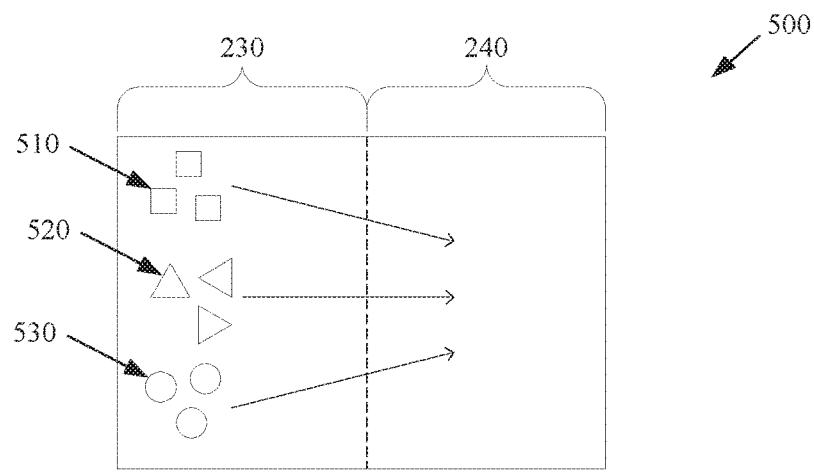
FIG. 5 is an illustration of an electrode array having a first zone to store mobile micro objects, according to implementations.

FIG. 5 is an illustration of an electrode array 500 having a first zone to store mobile micro objects, according to implementations. The electrode array 500 may include a first zone 230 (e.g., low resolution zone) and a second zone 240 (e.g., high resolution zone). For illustration purposes, the electrodes of the first zone 230 and second zone 240 are not shown. Mobile micro objects 510, 520 and 530 may be located above the electrode array 500 and at least partially submersed in an assembly medium. In implementations, the mobile micro objects 510, 520 and 530 may correspond to three different types of mobile micro objects. In one implementation, the mobile micro objects 510, 520 and 530 may be disposed in separate areas of the first zone 230 where they are stored separately from one another. The mobile micro objects 510, 520 and 530 may be held in place by a field generated by the electrodes of the electrode array 500 until they are needed for a micro assembly process. In another implementation, the mobile micro objects 510, 520 and 530 may have associated charges and may be disposed in the same area of the first zone 230. The field generated by the electrodes of the first zone 230 may arrange the mobile micro objects 510, 520 and 530 into separate areas of the first zone 230 based on the associated charges.

During the micro assembly process when one or more of the mobile micro objects 510, 520 and 530 are needed, the field generated by the electrodes of the first zone 230 may move the one or more mobile micro objects 510, 520 and 530 along the surface of the electrode array 500 from the first zone 230 to the second zone 240 as illustrated by the arrows of FIG. 5. When the one or more mobile micro objects 510, 520 and 530 arrive in the second zone 240 (e.g., high resolution zone) the one or more mobile micro objects 510, 520 and 530 may be moved into a specific position and orientation by the field generated by the electrodes in the second zone 240.

Figure 6:
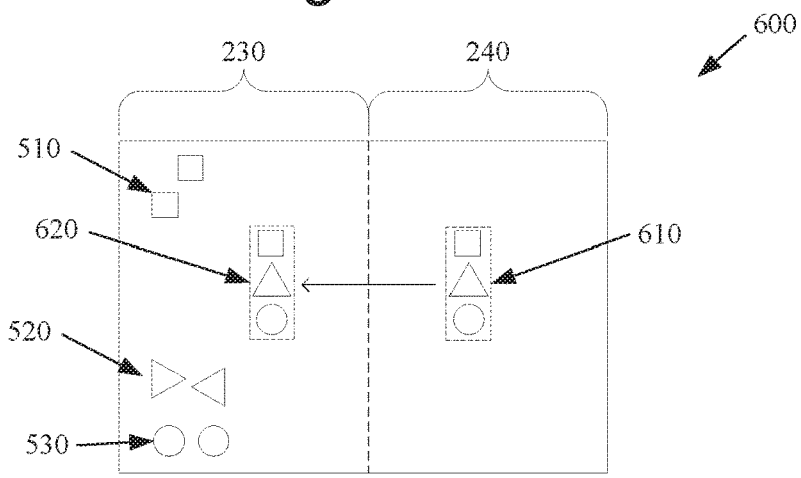
FIG. 6 illustrates an electrode array having a first zone to store intermediate assemblies of mobile micro objects.

FIG. 6 illustrates an electrode array 600 having a first zone to store intermediate assemblies of mobile micro objects. The electrode array 600 may include a first zone 230 (e.g., low resolution zone) and a second zone 240 (e.g., high resolution zone). For illustration purposes, the electrodes of the first zone 230 and second zone 240 are not shown. Mobile micro objects 510, 520 and 530 may be located above the electrode array 600 and at least partially submersed in an assembly medium. In implementations, the mobile micro objects 510, 520 and 530 may correspond to three different types of mobile micro objects. In one implementation, a field may be generated by the electrodes of the first zone 230 of the electrode array 600 to coarsely position and orient mobile micro objects 510, 520 and 530 within a defined area to form a coarse intermediate assembly, as will be discussed in FIG. 8. The mobile micro objects 510, 520 and 530 may be moved from the first zone 230 to the second zone 240 and into a specific position and orientation as previously described in FIG. 5 to create an intermediate assembly 610. The intermediate assembly 610 may include two or more of mobile micro objects 510, 520 and 530 arranged in specific positions and orientations. Once the intermediate assembly 610 has been assembled, the field generated by the electrodes in the second zone 240 may move the intermediate assembly 610 above the surface of the electrode array 600 into the first zone 230. The electrodes of the first zone 230 may then move the intermediate assembly 610 to a desired area for storage. In some implementations, this process may be repeated to create multiple intermediate assemblies 610 to be stored in the first zone 230. In other implementations, various intermediate assemblies may be created from different combinations and arrangements of mobile micro objects 510, 520 and 530 to be stored above the first zone 230.

Figure 7:
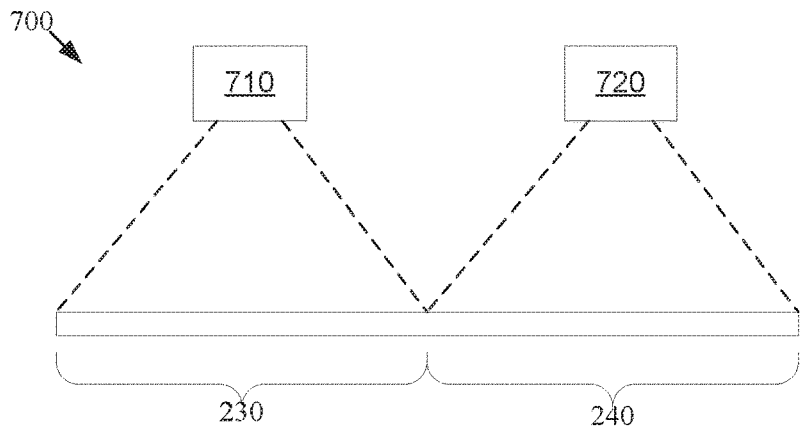
FIG. 7 illustrates an electrode array unit having light sources illuminating the first zone and second zone.

FIG. 7 illustrates a micro assembler unit 700 having light sources illuminating the first zone and second zone. The micro assembler unit 700 may include light sources 710 and 720. Light sources 710 and 720 may be similar to light source 160 of FIG. 1. The micro assembler unit 700 may include an electrode array 730 having a first zone 230 (e.g., low resolution zone) and a second zone 240 (e.g., high resolution zone). The first zone 230 and second zone 240 may include a plurality of phototransistors, which may become energized in response to exposure to light. The surface of the first zone 230 of the electrode array 730 may be exposed to light from light source 710, where the light source 710 projects an image corresponding to a field to position and orient the mobile micro objects. The phototransistors illuminated by the image may generate a field to attract, position and orient the mobile micro objects to a location above the electrode array 730. The phototransistors that are not illuminated by the projected image may not generate a field. Similarly, the surface of the second zone 240 of the electrode array 730 may be exposed to light from light source 720, where the light source 720 projects an image corresponding to a field to position and orient the mobile micro objects. For illustration purposes, light sources 710 and 720 are shown above the electrode array 730 and projecting images onto the top surface of the electrode array 730. However, in another implementation, light sources 710 and 720 may be located below the electrode array 730 and project the image onto the bottom surface of the electrode array 730.

In one implementation, the first zone 230 and the second zone 240 may include phototransistors and electrodes having the same range of spacing. The field generated by the electrode array 730 in the first zone 230 and the second zone 240 may be dependent on the resolution of the images projected on the surface of the electrode array 730 from light sources 710 and 720. In another implementation, one or both of light sources 710 and 720 may include a zoom lens (not shown) to change the focal length of one or both of light sources 710 and 720. The zoom lens may change the resolution of the image projected on the surface of the electrode array 730 by of one or both of light sources 710 and 720. In a further implementation, light sources 710 and 720 may be positioned at different distances from the electrode array 730 to change the resolution of the image projected on the surface of the electrode array 730.

Figure 8:
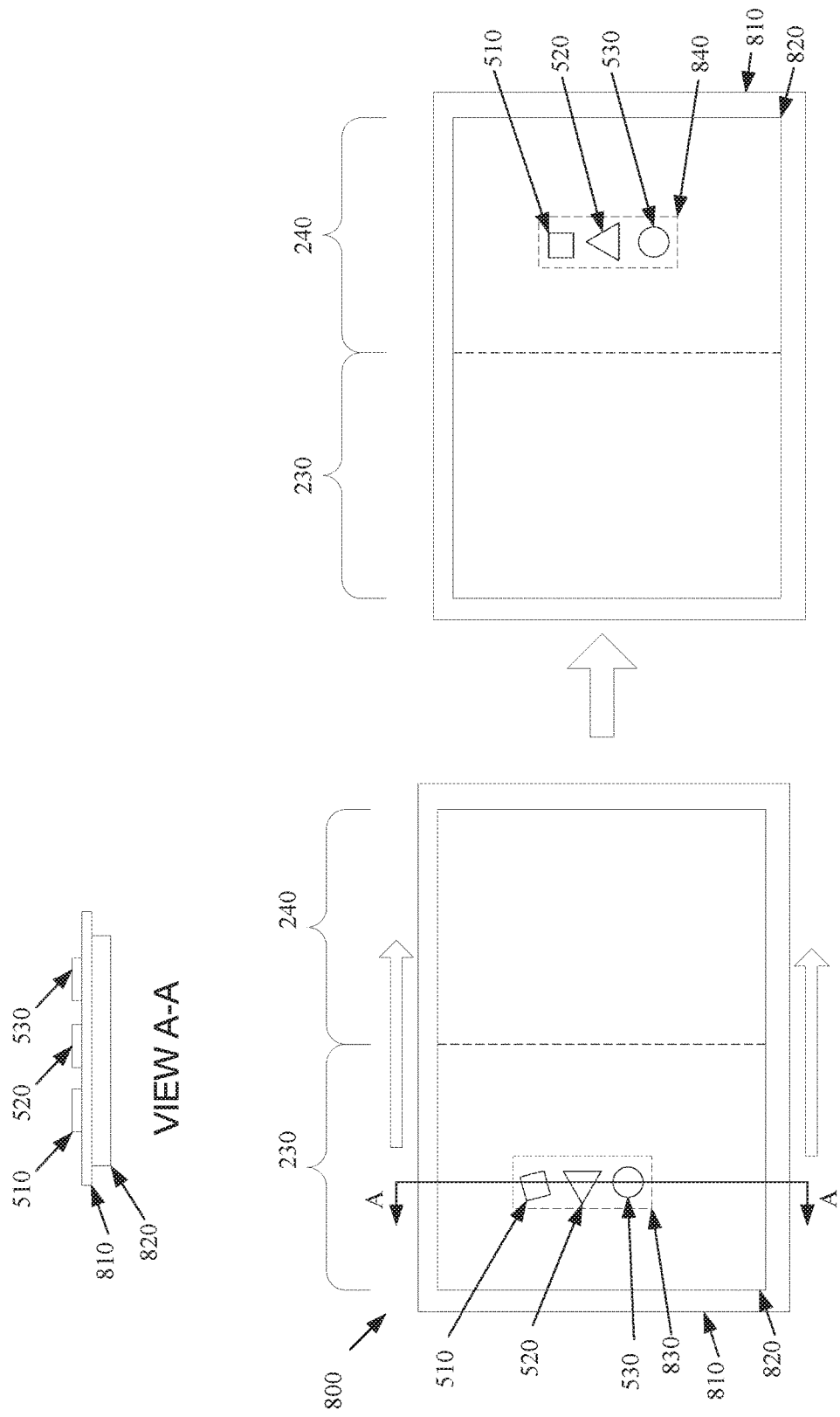
FIG. 8 illustrates an electrode array unit having a transfer film, according to implementations.

FIG. 8 illustrates a micro assembler unit 800 having a transfer film, according to implementations. The micro assembler unit 800 may include a transfer film 810 that is located between electrode array 820 and mobile micro objects 510, 520 and 530, as illustrated in cross-sectional view A-A. The transfer film 810 may be formed of dielectric material, plastic, glass or any suitable material. The transfer film 810 may be located above the first zone 230 of the electrode array 820. A field pattern may be generated by the electrodes (not shown) of the first zone 230 of the electrode array 820 to coarsely position and orient mobile micro objects 510, 520 and 530 within a defined area to form a coarse intermediate assembly 830. In implementations, one coarse intermediate assembly 830 may have mobile micro objects 510, 520 and 530 in a different position and orientation within the defined area when compared to a second coarse intermediate assembly 830. In one implementation, once mobile micro objects 510, 520 and 530 have been coarsely positioned above the first zone 230, the transfer film 810 may be relatively repositioned (e.g., by translating either the transfer film 810 or the microassembler 820) above the second zone 240 of the electrode array 820, as illustrated by the arrows of FIG. 8. After the transfer film 810 has been positioned above the second zone 240, the electrodes (not shown) of the second zone 240 may generate a field to finely position and orient mobile micro objects 510, 520 and 530 into a specific position and orientation within a defined area to form an intermediate assembly 840. In implementations, one intermediate assembly 840 may have mobile micro objects 510, 520 and 530 in approximately the same position and orientation as a second intermediate assembly 840. In one implementation, the mobile micro objects 510, 520 and 530 may be positioned and oriented in intermediate assemblies 840 and may have a tolerance between +/−1 micron and +/−10 microns, inclusive. In another implementation, once mobile micro objects 510, 520 and 530 have been coarsely positioned above the first zone 230, the electrode array 820 may be repositioned so that the second zone 240 of the electrode array 820 is below mobile micro objects 510, 520 and 530. After the second zone 240 of the electrode array 820 has been positioned below mobile micro objects 510, 520 and 530, the electrodes of the second zone 240 may generate a field to finely position and orient the mobile micro objects 510, 520 and 530 into a specific position and orientation to form the intermediate assembly 840.

Figure 9:
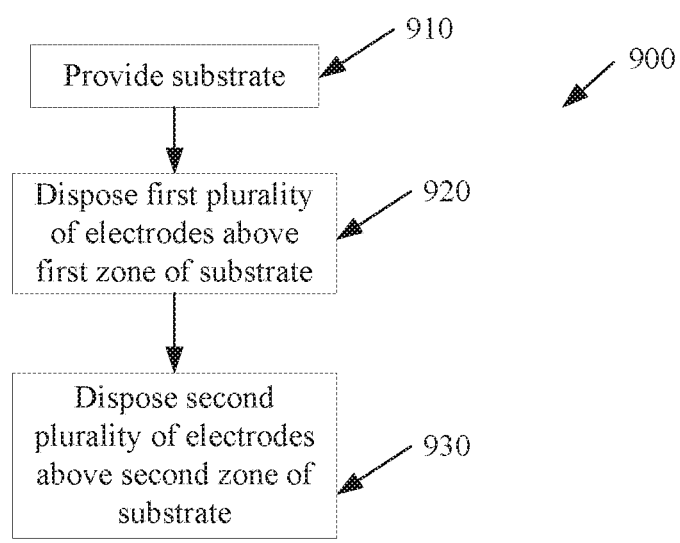
FIG. 9 illustrates a process flow for fabricating an electrode array, according to implementations.

FIG. 9 illustrates a process flow 900 for fabricating an electrode array, according to implementations. At block 910, a substrate may be provided. In one implementation, the substrate may be a substantially planar substrate. In another implementation, the substrate may include non-planar structures. At block 920, electrodes may be disposed above a first zone of the substrate. The electrodes may be disposed using a photolithography process, a soft lithography process, high resolution patterning or any similar process. In one implementation, the electrodes disposed above the first zone may have a range of spacing between 15-1000 microns, inclusively. In another implementation, the electrodes disposed above the first zone may have a range of spacing that decreases near the second zone of the substrate. In a further implementation, the electrodes disposed above the first zone may have a range of spacing that is determined in order to optimize a micro assembly process.

At block 930, electrodes may be disposed above a second zone of the substrate. The electrodes may be disposed using a photolithography process, a soft lithography process, high resolution patterning or any similar process. In one implementation, the electrodes disposed above the second zone may have a range of spacing between 1-50 microns, inclusively. In another implementation, the range of spacing of the electrodes disposed above the second zone may be less than the range of spacing of the electrodes disposed above the first zone. In another implementation, the electrodes disposed above the second zone may have a range of spacing that decreases near the center of the second zone. In a further implementation, the electrodes disposed above the second zone may have a range of spacing that is determined in order to optimize a micro assembly process.

Various operations are described as multiple discrete operations, in turn, in a manner that is most helpful in understanding the present disclosure, however, the order of description may not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer disposed above or over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form.

Moreover, use of the term "an implementation" or "one implementation" throughout is not intended to mean the same implementation or implementation unless described as such. The terms "first," "second," "third," "fourth," etc. as used herein are meant as labels to distinguish among different elements and may not necessarily have an ordinal meaning according to their numerical designation.

It will be appreciated that variants of the above-disclosed and other features and functions, or alternatives thereof, may be combined into many other different systems of applications. Various presently unforeseen or unanticipated alternatives, modifications, variations, or improvements therein may be subsequently made by those skilled in the art which are also intended to be encompassed by the following claims.

What is claimed is:

1. A method comprising:
providing a substrate;
disposing a first plurality of electrostatic potential presenting electrodes above a first zone of the substrate, wherein the first plurality of electrodes has a first range of spacing;
disposing a second plurality of electrostatic potential presenting electrodes above a second zone of the substrate, wherein the second plurality of electrodes has a second range of spacing that is less than the first range of spacing; and
disposing a transfer film above the first plurality of electrostatic potential presenting electrodes and the second plurality of electrostatic potential presenting electrodes, wherein the transfer film is detachable from the first plurality of electrostatic potential presenting electrodes and the second plurality of electrostatic potential presenting electrodes.

2. The method of claim 1, further comprising:
disposing a dielectric layer above the first plurality of electrostatic potential presenting electrodes and the second plurality of electrodes.

3. The method of claim 1, wherein a top surface of the substrate is comprised of non-planar features.

4. The method of claim 1, wherein disposing at least one of the first plurality of electrostatic potential presenting electrodes or the second plurality of electrostatic potential presenting electrodes comprises a soft lithography process.

5. The method of claim 1, wherein disposing at least one of the first plurality of electrostatic potential presenting electrodes or the second plurality of electrostatic potential presenting electrodes comprises a high resolution patterning process.

6. The method of claim 1, wherein disposing at least one of the first plurality of electrostatic potential presenting electrodes or the second plurality of electrostatic potential presenting electrodes comprises a photolithography process.

7. The method of claim 1, wherein disposing at least one of the first plurality of electrostatic potential presenting electrodes or the second plurality of electrostatic potential presenting electrodes comprises forming a multi-phase electrode assembly.

8. A method of manipulating a mobile particle comprising:
disposing an electrode array at least partially submersed in an assembly medium;
disposing the mobile particle, separate from the electrode array, at least partially submersed in the assembly medium above the electrode array, the electrode array comprising a substrate having a first plurality of electrodes above a first zone of the substrate and a second plurality of electrodes above a second zone of the substrate; and conducting a field through individual electrodes of the first plurality of electrodes and the second plurality of electrodes to generate electrophoretic forces or dielectrophoretic forces on the mobile particle.

9. The method of claim 8, wherein conducting the field through the individual electrodes of the first plurality of electrodes coarsely registers the mobile particle above the first zone.

10. The method of claim 8, wherein conducting the field through the individual electrodes of the second plurality of electrodes precisely registers the mobile particle above the second zone.

11. The method of claim 8, further comprising:
disposing a plurality of first mobile particles at least partially submersed in the assembly medium in a first area above the first zone;
disposing a plurality of second mobile particles at least partially submersed in the assembly medium in a second area above the first zone;
conducting the field through the individual electrodes of the first plurality of electrodes to store the plurality of first mobile particles in the first area and the plurality of second mobile particles in the second area.

12. The method of claim 8, further comprising:
disposing a plurality of first mobile particles at least partially submersed in the assembly medium above the first zone, wherein the plurality of first mobile particles has an associated first charge;
disposing a plurality of second mobile particles at least partially submersed in the assembly medium above the first zone, wherein the plurality of second mobile particles has an associated second charge;
conducting the field through the individual electrodes of the first plurality of electrodes to arrange the plurality of first mobile particles and the plurality of second mobile particles into separate areas above the first zone based on the associated first charge and the associated second charge.

13. The method of claim 8, further comprising:
disposing a plurality of first mobile particles and a plurality of second mobile particles at least partially submersed in the assembly medium above the first zone;
conducting the field through the individual electrodes of the first plurality of electrodes to arrange a first particle of the plurality of first mobile particles and a second particle of the plurality of second mobile particles to form a coarse intermediate assembly;
conducting the field through the individual electrodes of the first plurality of electrodes and the second plurality of electrodes to position the coarse intermediate assembly above the second zone of the substrate; and conducting the field through the individual electrodes of the second plurality of electrodes to precisely arrange the coarse intermediate assembly to form an intermediate assembly.

14. The method of claim 13, further comprising:
conducting the field through the individual electrodes of the first plurality of electrodes and the second plurality of electrodes to position the intermediate assembly above the first zone, the intermediate assembled to be stored above the first zone.

15. The method of claim 8, wherein conducting the field through the individual electrodes further comprises:
sequentially changing a voltage provided to a first, a second, a third and a fourth electrode of at least one of the first plurality of electrodes or the second plurality of electrodes to generate a potential wave.

16. A method of manipulating a mobile particle comprising:
disposing the mobile particle at least partially submersed in an assembly medium above a substrate comprising a first plurality of electrodes above a first zone of the substrate and a second plurality of electrodes above a second zone of the substrate; and
conducting a field through individual electrodes of the first plurality of electrodes and the second plurality of electrodes to generate electrophoretic forces or dielectrophoretic forces on the mobile particle, wherein conducting the field through the individual electrodes further comprises:
illuminating, by a light source, the individual electrodes of at least one of the first plurality of electrodes or the second plurality of electrodes, wherein the individual electrodes of the first plurality of electrodes or the second plurality of electrodes generate the field in response to being illuminated by the light source.

17. The method of claim 16, wherein the light source illuminates the individual electrodes of the first plurality of electrodes further comprising:
illuminating, by a second light source, the individual electrodes of the second plurality of electrodes, wherein the individual electrodes of the second plurality of electrodes generate the field in response to being illuminated by the second light source.

18. The method of claim 17, wherein a resolution of the second light source is greater than or equal to the resolution of the light source.

19. The method of claim 17, wherein conducting the field through the individual electrodes further comprises:
selectively energizing, by a controller operatively coupled to a power source, the individual electrodes of at least one of the first plurality of electrodes or the second plurality of electrodes to generate the field.

* * * * *